(12) United States Patent
Dal Farra (10) Patent No.: US 6,201,873 B1
(45) Date of Patent: Mar. 13, 2001

(54) LOUDSPEAKER-DEPENDENT AUDIO COMPRESSION

(75) Inventor: David Dal Farra, Nepean (CA)

(73) Assignee: Nortel Networks Limited, Montreal (CA)

(*) Notice: Subject to any disclaimer, the term of this patent is extended or adjusted under 35 U.S.C. 154(b) by 0 days.

(21) Appl. No.: 09/092,851

(22) Filed: Jun. 8, 1998

(51) Int. Cl.⁷ .................................................. H03G 5/00
(52) U.S. Cl. .............................................. 381/100; 381/55
(58) Field of Search ........................... 381/100, 55, 106

(56) References Cited

U.S. PATENT DOCUMENTS

| | | | |
|---|---|---|---|
| 4,395,597 | * 7/1983 | Suzuki et al. | 181/170 |
| 5,046,874 | * 9/1991 | St. Clair | 400/689 |
| 5,528,695 | * 6/1996 | Klippel | 381/55 |
| 5,548,650 | * 8/1996 | Clark | 381/55 |
| 6,014,059 | * 1/2000 | Nordwall | 330/289 |

* cited by examiner

Primary Examiner—Forester W. Isen
Assistant Examiner—Brian Tyrone Pendleton (57) ABSTRACT

The invention is an audio compression system for reducing distortion arising primarily from excessive loudspeaker excursion. For a given input audio signal, the maximum signal magnitude (or envelope, energy or power) level above which the loudspeaker will begin to distort is dependent upon the frequency content of the signal. In this invention, the input audio signal is filtered and the magnitude (or envelope, energy or power) level of the filtered signal is compared to a single, constant threshold level. The input audio signal is subsequently compressed only if the magnitude (or envelope, energy or power) level of the filtered audio signal exceeds the threshold value. In one embodiment, the filter has a frequency response which models the excursion response of the loudspeaker in question, and which can be obtained analytically for various types of loudspeakers. In another embodiment, the filter has a frequency response which is related to an experimental curve describing the maximum voltage leading to just acceptable distortion as a function of frequency. By attenuating only those signals which cause distortion (due primarily to excessive loudspeaker excursion), efficiency of the audio compression system is improved.

15 Claims, 4 Drawing Sheets

LOUDSPEAKER-DEPENDENT AUDIO COMPRESSION

FIELD OF THE INVENTION

The present invention relates to audio systems in general, and more particularly to a method and apparatus for reducing distortion arising primarily from excessive loudspeaker excursion. The invention is applicable to the majority of loudspeaker types used in a variety of audio equipment, such as handset and hands-free telephone terminals, car sound systems, personal stereophonic equipment and home theatre systems.

BACKGROUND OF THE INVENTION

The fundamental principle behind loudspeaker operation is the controlled displacement of air in accordance with an applied electrical voltage signal. Usually, a membrane or diaphragm of some sort is the actual mechanical interface with the surrounding air, which oscillates in tandem with the variations in the electrical signal. If these oscillations have frequency content between approximately 20 and 20,000 cycles per second (Hz), then the resulting air pressure waves are audible to the healthy human ear, being perceived as sound.

In the audio system art, a common type of loudspeaker is the electrodynamic loudspeaker, which comprises a current-carrying coil placed in a gap, across which is applied a magnetic field. As the electric potential applied across the coil is varied, a corresponding force is exerted on the coil, causing the coil to move back and forth along its axis, perpendicularly to the magnetic field. The coil is attached to a diaphragm which displaces air as the coil oscillates.

For a given oscillatory voltage waveform applied to the coil, the oscillations will produce a certain displacement of the coil relative to the rest position of the coil, known as the "excursion" of the loudspeaker. If the applied voltage is of sufficient amplitude at a given frequency, the magnetomotive force will be large enough to cause the coil to partially exit the magnetic field. That is to say, the number of coil windings immersed in the magnetic field becomes a function of time, altering both the magnetomotive force and the loudspeaker impedance. The excursion, being directly related to the magnetomotive force for a sinusoidal voltage at a given frequency, no longer varies in accordance with the voltage as when the coil is fully immersed in the gap. Consequently, the sound produced by the loudspeaker will be distorted.

The notions of excursion and of the influence of excessive excursion on signal distortion are applicable to virtually all types of loudspeakers currently in use. Irrespective of the type of loudspeaker, therefore, a high degree of audio fidelity is achievable only if distortion is kept to a minimum. As it has been found that a primary cause of distortion is excessive excursion, it follows that it is crucial to keep the loudspeaker excursion to within acceptable limits. In the case of an electrodynamic loudspeaker, this ensures that the coil will remain entirely set in the magnetic field.

In the prior art, it is known to limit the excursion of an electrodynamic loudspeaker by adjusting the suspension mechanism so as to physically prevent the coil from leaving the magnetic field. This often leads to undesirable acoustic effects which can be as severe as audible thuds.

A more satisfactory prior art solution is to limit the voltage signal applied to the loudspeaker by inserting a so-called compressor in the audio path prior to sound reproduction. If the total energy of the audio signal at a given time exceeds a threshold value, then the compressor attenuates the voltage level of the audio signal; otherwise, the compressor does not affect the voltage level of the audio signal. The threshold value is chosen to limit loudspeaker excursion to acceptable values which do not cause distortion. Compressors of this nature are well known and used in the audio system art.

However, the use of compressors such as those found in prior art teachings does not recognize the importance of considering the behaviour of loudspeaker excursion as a function of frequency. For instance, it has been observed that for an acoustic signal level of a given amplitude, loudspeaker excursion is greater when the signal has energy clustered at lower frequencies, assuming that the signal is in the speaker's pass band. The precise relationship will depend on the mechanical, electrical and acoustical details of the loudspeaker, but excursion versus frequency generally has a low-pass character.

In a typical telecommunications scenario, if the audio signal represents human voice, then the short-term energy content of the signal will be concentrated in a region of the frequency spectrum that depends on the phoneme being uttered by the talker. If the energy is mostly to be found at lower frequencies, such as in the pronunciation of vowels, then the gain of the audio signal should be limited to prevent the onset of distortion due to loudspeaker excursion.

On the other hand, the energy may be clustered around higher frequencies, such as during articulation of fricative consonants, in which case even an increase in gain would not cause the loudspeaker to introduce distortion. However, as prior art compressors limit the gain of the audio signal solely based on total energy, and not on its distribution across the frequency spectrum, the loudspeaker may find itself reproducing signals that may have undergone unnecessary limiting. Prior art systems using audio compression are thus inefficient and do not use the entire audio system loudness headroom when dealing with signals having varying short-term frequency content.

SUMMARY OF THE INVENTION

It is an object of the present invention to mitigate or obviate one or more disadvantages of the prior art.

Therefore, according to a first broad aspect, the invention may be summarized as an audio compression system for connection to a loudspeaker exhibiting a frequency-dependent excursion response for signals having a constant amplitude, the system comprising: variable gain means for controllably varying an input audio signal in accordance with a control signal, thereby to produce an output audio signal; an electronic filter connected to the input audio signal in a control path, for filtering the input audio signal and producing a filtered audio signal; and a first detector for measuring the level of a characteristic present in the filtered audio signal, comparing the measured level to a first threshold level, determining a first gain limit related to the difference between the measured and threshold levels and setting the control signal to the first gain limit thus determined; wherein the filter has a magnitude frequency response resembling the excursion response of the loudspeaker over a frequency range.

According to a second broad aspect, the invention may be summarized as an audio compression system for connection to a loudspeaker exhibiting a specifiable amount of distortion at a signal level which depends on the frequency of the signal being input to the loudspeaker, wherein the signal level plotted versus frequency describes a "maximum voltage response", the system comprising: variable gain means for controllably varying an input audio signal in accordance with a control signal, thereby to produce an output audio signal; an electronic filter connected to the input audio signal in a control path, for filtering the input audio signal and producing a filtered audio signal; and a first detector for measuring the level of a characteristic present in the filtered audio signal, comparing the measured level to a threshold level, determining a first gain limit related to the difference between the measured and threshold levels and setting the control signal to the first gain limit thus determined; wherein the filter has a magnitude frequency response resembling the maximum voltage response of the loudspeaker over a frequency range, reflected about an arbitrary point in said frequency range.

The invention may be summarized according to a third broad aspect as a method of controllably modifying an input audio signal to produce an output audio signal for connection to a loudspeaker exhibiting a frequency-dependent excursion response for signals having a constant amplitude, the method comprising the steps of: electronically filtering the input audio signal to produce a filtered audio signal, wherein the input audio signal has frequency content over a frequency range, and wherein filtering is achieved by modifying the frequency content of the input audio signal in accordance with a shape resembling the excursion response of the loudspeaker over said frequency range; measuring the level of a characteristic present in the filtered audio signal; comparing the measured level to a threshold level; and controllably attenuating the input audio signal in accordance with the difference between the measured and threshold levels, thereby to produce the output audio signal.

According to a fourth broad aspect, the invention may be summarized as a method of controllably modifying an input audio signal to produce an output audio signal for connection to a loudspeaker exhibiting a specifiable amount of distortion at a signal level which depends on the frequency of the signal being input to the loudspeaker, wherein the signal level plotted versus frequency describes a "maximum voltage response", the method comprising the steps of: electronically filtering the input audio signal to produce a filtered audio signal, wherein the input audio signal has frequency content over a frequency range, and wherein filtering is achieved by modifying the frequency content of the input audio signal in accordance with a shape resembling the maximum voltage response of the loudspeaker over a frequency range, reflected about an arbitrary point in said frequency range; measuring the level of a characteristic present in the filtered audio signal; comparing the measured level to a threshold level; and controllably attenuating the input audio signal in accordance with the difference between the measured and threshold levels, thereby to produce the output audio signal.

BRIEF DESCRIPTION OF THE DRAWINGS

The preferred embodiment of the present invention will now be described with reference to the following figures, in which.

DETAILED DESCRIPTION OF THE PREFERRED EMBODIMENT

Figure 1:
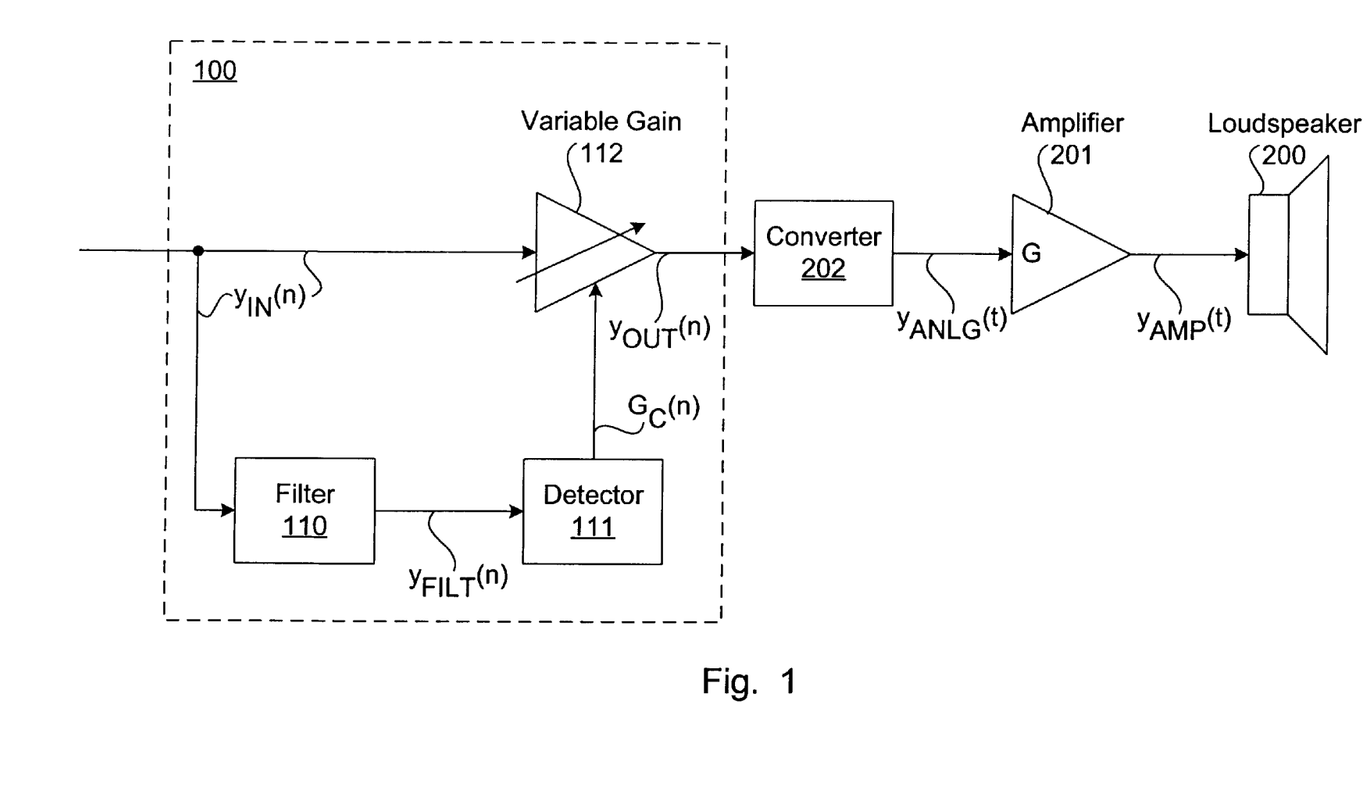
FIG. 1 is a block diagram of an audio compression system in accordance with the preferred embodiment of the present invention.

Reference is made to FIG. 1, in which is shown a block circuit diagram of a digital audio compression system (or "audio compressor") 100 in accordance with the preferred embodiment of the present invention. A stream of input audio samples $y_{IN}(n)$ enters a variable gain device 112, where the samples are controllably attenuated (or amplified) according to a compressor gain $G_C(n)$, producing a stream $y_{OUT}(n)$ of compressed audio samples, defined by $y_{OUT}(n) = G_C(n) \cdot y_{IN}(n)$ The variable gain device 112 is essentially a digital multiplier, the use of which is well known in the audio system art.

The input audio signal $y_{IN}(n)$ is also fed in a control path to a filter 110 which produces a filtered audio signal $y_{FILT}(n)$ that is fed to a signal magnitude detector 111. The filter 110 is typically a finite-impulse-response (FIR) or infinite-impulse-response (IIR) filter comprising a number of taps, and having a specifiable frequency response. This frequency response will depend on the distortion behaviour of the particular loudspeaker(sealed box, vented box, etc.) Being employed. A method for specifying the precise shape of the frequency response will be described hereunder.

At every sample time n, the signal magnitude detector 111 continuously calculates the signal magnitude level $E_{FILT}(n)$ of the filtered audio signal $y_{FILT}(n)$ and, upon comparing this value to a threshold $E_{XMAX}$, determines the value of the compressor gain $G_C(n)$ that is fed to the variable gain device 112. The signal magnitude detector 111 is preferably implemented as a digital signal processor running an energy or envelope detection algorithm applied to the stream of input samples $y_{FILT}(n)$. The signal magnitude detector 111 also performs a comparison operation for determining the compressor gain $G_C(n)$ from $E_{FILT}(n)$ and $E_{XMAX}$.

The audio compressor 100 is shown connected to a digital-to-analog converter 202, into which enters the compressed audio stream $y_{OUT}(n)$, and the resultant analog signal $y_{ANLG}(t)$ is subsequently fed to an optional analog amplifier 201, which applies a constant gain G, yielding an amplified audio signal $y_{AMP}(t)$ that is fed to a loudspeaker 200.

In operation, the filter 110 in the audio compressor 100 alters the frequency content of the audio signal $y_{IN}(n)$, which biases the signal magnitude level of $y_{FILT}(n)$ as detected by the signal magnitude detector 111; Since excursion is usually the single most important contributor to loudspeaker distortion, it follows that filtering the audio samples $y_{IN}(n)$ by a filter having a frequency response equal to the excursion versus frequency relationship of the loudspeaker will thus provide a control signal $y_{FILT}(n)$ whose amplitude will be large if $y_{IN}(n)$ is likely to be distorted by the loudspeaker. Therefore, subsequently performing a signal magnitude detection operation on $y_{FILT}(n)$ would yield a simple criterion for deciding whether or not to attenuate $y_{IN}(n)$ so as to avert distortion. This is precisely the rationale behind suggesting that the filter 110 have a frequency response whose shape approximates the excursion versus frequency characteristic of the loudspeaker.

Figure 2A:
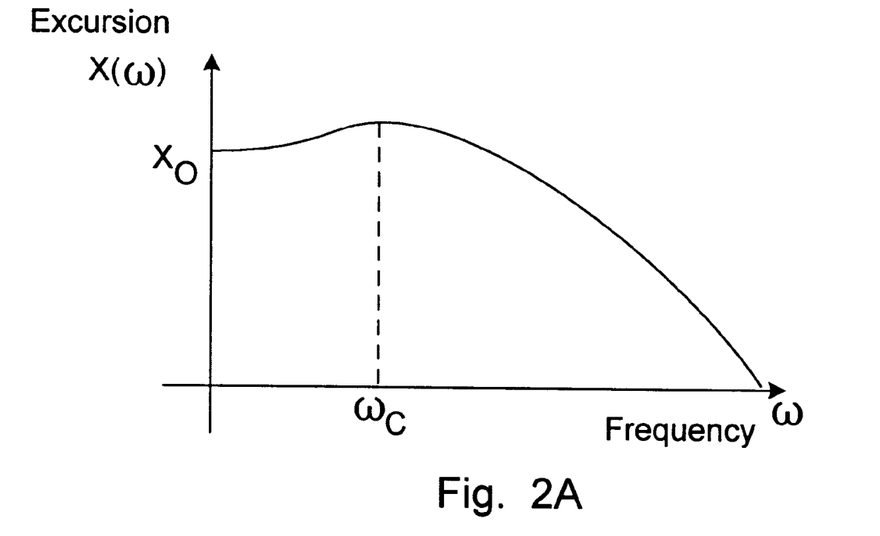
FIG. 2A shows an example of the variation of loudspeaker excursion as a function of frequency for an electrodynamic loudspeaker in a sealed box, based on an analytical model.

By way of example, FIG. 2A illustrates how the excursion $X(\omega)$ for a sealed-box electrodynamic loudspeaker varies with the frequency $\omega$ of an applied sinusoidal voltage of fixed amplitude. In this particular case, it is observed that $X(\omega)$ has a value approximately equal to $X_O$ for frequencies below a cutoff ("resonant") frequency $\omega_C$, above which the excursion drops off at 12 dB per octave. For hands-free telephones employing such a loudspeaker, the cutoff frequency $\omega_C$ typically ranges from 180 to 400 Hz; in other applications, $\omega_C$ may be outside this relatively narrow range.

Figure 2B:
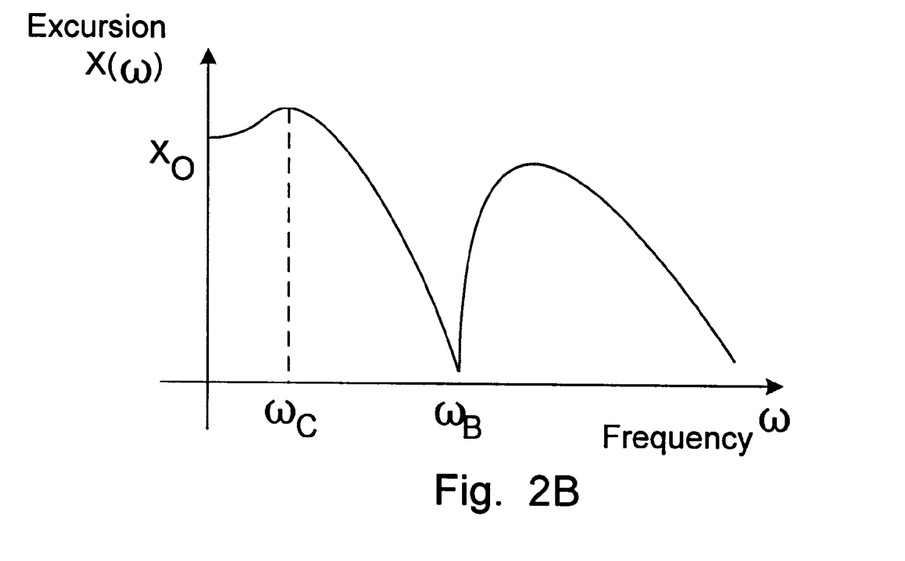
FIG. 2B shows an example of the variation of loudspeaker excursion as a function of frequency for an electrodynamic loudspeaker in a vented box, based on an analytical model.

The relationship depicted in FIG. 2A characterizes a free-air or sealed-enclosure electrodynamic loudspeaker and may be modelled as a second-order low-pass response, which is mathematically described as:

$$X(\omega) = k_1 \left| \frac{\omega_C^2}{s^2 + s\frac{\omega_C}{Q} + \omega_C^2} \right|$$

where $s=\sqrt{-1}\cdot\omega$, Q is a resonance quality factor, $\omega_C$ is the system resonant frequency, and $k_1$ is a proportionality constant. Without much difficulty, a skilled person in the art can derive the analytical equation describing the frequency-dependent excursion of a loudspeaker in a vented box, or in fact for many other types of loudspeakers. For example, a vented-box loudspeaker has the following relationship (depicted in FIG. 2B):

$$X(\omega) = k_2 \left| \frac{s^2 T_B^2 + s\frac{T_B}{Q_L} + 1}{D(s)} \right|$$

where $$D(s) = s^4 T_B^2 T_S^2 + s^3 \left( \frac{T_B^2 T_S}{Q_T} + \frac{T_B T_S^2}{Q_L} \right) +$$

$$s^2 \left[ (\alpha+1)T_B^2 + \frac{T_B T_S}{Q_L Q_T} + T_S^2 \right] +$$

$$s\left( \frac{T_B}{Q_L} + \frac{T_S}{Q_T} \right) + 1$$

and where $T_S=1/\omega_S^2$, $T_B=1/\omega_B^2$, $\omega_S$ is the free air resonant frequency of the loudspeaker, $\omega_B$ is the resonance frequency of the enclosure-vent circuit, $Q_L$ is the enclosure quality factor at $\omega_B$ due to enclosure and vent losses, $Q_T$ is the driver quality factor at $\omega_S$ in free air, $\alpha$ is the system compliance ratio, and $k_2$ is another constant of proportionality.

When excursion is the principal cause of distortion, reflecting the excursion versus frequency curve about an arbitrary point provides a relatively accurate model for the shape of the maximum voltage (leading to just acceptable distortion) as a function of frequency. Unfortunately, for many types of speakers, including electrodynamic ones, the mechanical, acoustical or electrical properties of the component limit the extent to which an analytical model of the excursion is faithful to the distortion behaviour of the loudspeaker.

Figure 3:
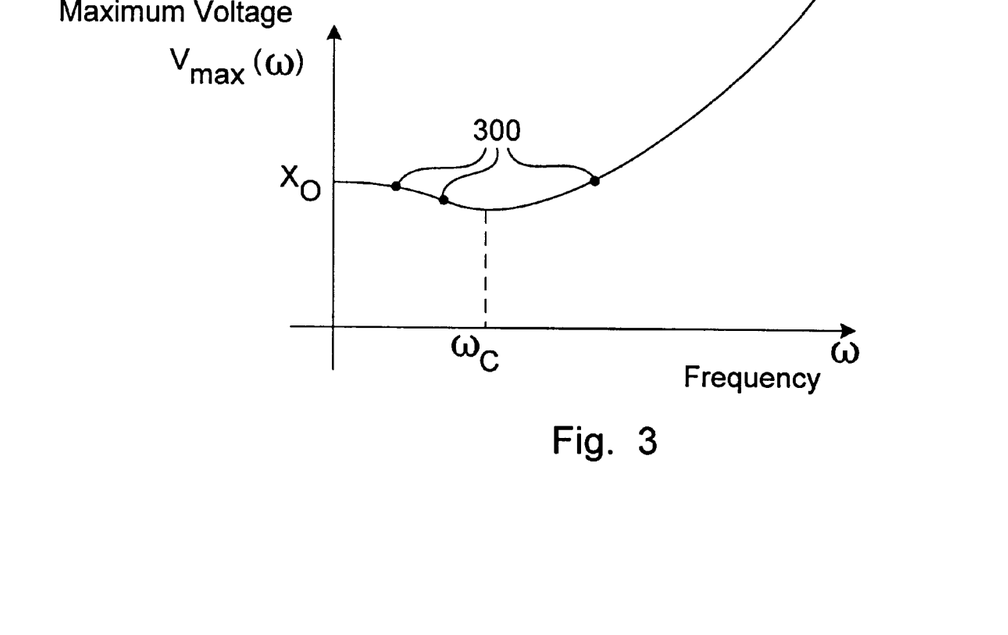
FIG. 3 shows the maximum gain that can be applied to a sinusoid of a given frequency prior to the onset of loudspeaker distortion, which could be based on empirical measurements.

In order to obtain an accurate "maximum voltage leading to just acceptable distortion" versus frequency, or $v_{max}(\omega)$, curve in these cases, it is preferable to apply a sinusoidal voltage of a given frequency $\omega$ to the loudspeaker and subsequently measure the maximum amplitude of the voltage $v_{max}(\omega)$ that can be applied immediately prior to the onset of just acceptable distortion at that frequency. Many tools exist for measuring the amount of distortion generated by a loudspeaker, and an arbitrary level of distortion can be chosen as "just acceptable". The maximum voltage $v_{max}(\omega)$ at each frequency $\omega$ is plotted as a function of frequency, which may produce a graph such as that shown in FIG. 3.

Figure 4:
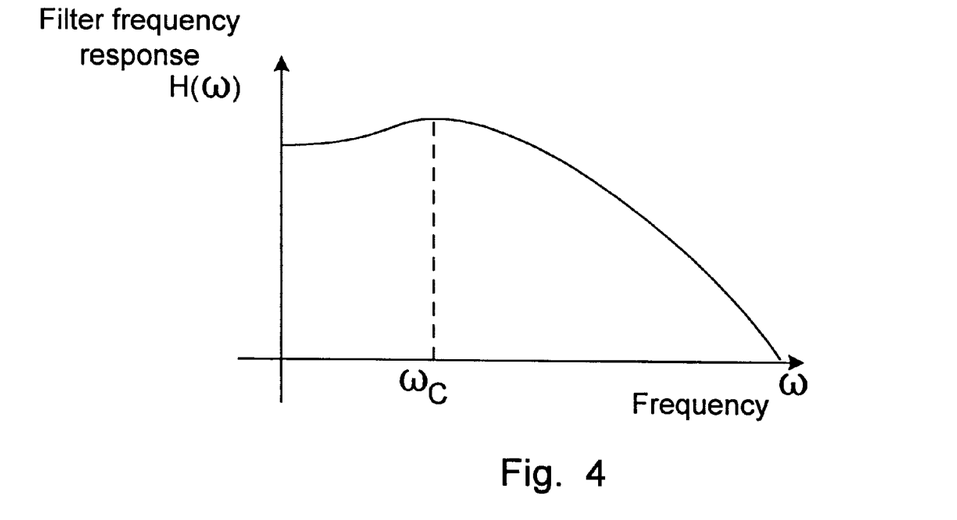
FIG. 4 shows the curve in FIG. 3 reflected about an arbitrary point on the curve, giving the model frequency response shape for the filter in FIG. 1.

A point on the graph of $v_{max}(\omega)$ is selected (preferably one having non-zero magnitude), and the curve is reflected about this point. For example, reflecting the voltage curve $v_{max}(\omega)$ of FIG. 3 about any arbitrary point 300 yields the distortion response shape $H(\omega)$ in FIG. 4. In many cases, for a sealed-box electrodynamic loudspeaker operating in a controlled-temperature environment, the distortion response curve $H(\omega)$ will be very similar in shape to the excursion response curve $X(\omega)$ in FIG. 2A, i.e., inversion of the experimental maximum voltage curve fairly closely matches the expected analytical result that treats only the excursion.

Once the distortion curve shape $H(\omega)$ has been obtained, this is used as the frequency response shape of the filter 110. It is simple for one of ordinary skill in the art to determine the length of the filter and the relative values of the filter taps which provide the pole and zero locations required for adequate modelling of the desired frequency response shape $H(\omega)$.

The overall magnitude of the filter frequency response will then be offset by a normalization factor, the value of which will depend on the particular noise and clipping performance at each node in the audio compression system 100. For example, it can be determined by passing a sinusoidal voltage signal $y_{IN}(n)$ of fixed frequency and maximum expected input signal level through the filter 110 having the desired shape but a low gain. (During this calibration procedure, the filter would be connected directly to the converter 202, bypassing the signal magnitude detector 111 and variable gain device 112, and the converter 202 and amplifier 201 are assumed not to clip before the loudspeaker 200 distorts.) The filter gain is subsequently boosted until just acceptable distortion appears at the output of the loudspeaker, and the normalization factor is chosen to set to the gain thus determined.

For most sealed-enclosure electrodynamic loudspeakers, the frequency response of the filter 110 will exhibit a second-order low-pass behaviour, and the filtered audio signal $y_{FILT}(n)$ will thus be a version of the input audio signal $y_{IN}(n)$ having frequency content that is more attenuated at higher frequencies than at lower ones. Thus, if the audio signal $y_{IN}(n)$ possesses only low-frequency content, i.e., in the frequency range below $\omega_C$ (or $\omega_B$), it is virtually unaltered by the filter 110, whereas an utterance with high-frequency content is significantly attenuated prior to entering the signal magnitude detector 111.

After leaving the filter 110, the filtered audio signal $y_{FILT}(n)$ enters the signal magnitude detector 111. The signal magnitude detector 111 measures, for example, the envelope level $E_{FILT}(n)$ of $y_{FILT}(n)$. Envelope detection is well known and used in the art, and can approximately be described as extracting a smooth outline traced by the peaks of the (arbitrary) input signal. This can be done by passing the filtered audio signal $y_{FILT}(n)$ through another filter (at the input stage of the signal magnitude detector 111) having suitable attack and decay rates, which help render the waveform smoother, but with sufficient speed to acceptably control distortion on signals with high crest factors.

It is important to consider that the envelope detector used in the signal magnitude detector 111 can be replaced by a component or algorithm that measures a property of the filtered audio signal $y_{FILT}(n)$ which is related to its energy, but may be different from the envelope. Other methods for obtaining estimates of the energy or of an energy-related property may therefore be used, such as simply taking the magnitude of the filtered audio signal, storing it and summing with previous magnitudes (or squared magnitudes) across a given window of samples. Alternatively, the energy detector may perform a short-time Fourier transform (STFT) of the filtered audio signal $y_{FILT}(n)$, subsequently taking the magnitude of the STFT and summing across the entire frequency spectrum. This summation, performed periodically, yields an estimate of the energy contained in a short segment of the filtered audio signal $y_{FILT}(n)$. More sophisticated energy estimates may require additional filtering and more complex processing.

Once the envelope level $E_{FILT}(n)$ of the filtered audio signal $y_{FILT}(n)$ has been measured, it is compared to a threshold level $E_{XMAX}$ prior to determining the value of the compressor gain $G_C(n)$. Due to the frequency-dependent behaviour of the loudspeaker excursion (and, more generally, the loudspeaker distortion), it is easy to see that each possible spectral shape of $y_{IN}(n)$ has its own threshold above which distortion occurs. However, measuring the envelope of the filtered audio signal $y_{FILT}(n)$ provides a biased estimate of the envelope (or energy) of the unfiltered audio signal $y_{IN}(n)$, which already takes into account the frequency-dependent distortion characteristics of the loudspeaker. Therefore the single threshold level $E_{XMAX}$ can be used.

For a given loudspeaker, the value $E_{XMAX}$ will depend on the noise and clipping performance of each node in the audio compression system 100. For example, a default gain is chosen for the variable gain device 112, e.g., a "no compression" gain of unity. A sinusoid of fixed frequency (preferably at $w_C$ for sealed-box loudspeakers and at $w_B$ for vented-box components) is provided as $y_{IN}(n)$, and its amplitude is increased until just acceptable distortion levels appear at the output of the loudspeaker. $E_{XMAX}$ is set equal to the value of the signal magnitude detected by the signal magnitude detector 111 at that time. (Of course, the filter 110 and variable gain device 112 would be disabled during this calibration procedure.)

In use, i.e., after calibration is complete, the signal magnitude detector 111 provides the variable gain device 112 with a gain $G_C(n)=\min[1,E_{XMAX}/E_{FILT}(n)]$. This bounds the end-to-end level that is achievable by a signal passing though the audio compression system. After having been compressed in this manner (assuming that the converter 202 and amplifier 201 do not cause distortion of their own), the compressed audio signal $y_{OUT}(n)=G_C(n)\cdot y_{IN}(n)$ is guaranteed not to cause the loudspeaker 200 to distort. For most sealed-box loudspeakers, $y_{OUT}(n)$ is permitted to have relatively more energy at higher frequencies, thereby to capitalize on the properties of the particular loudspeaker being employed.

As mentioned, if the filter gain and $E_{XMAX}$ are calibrated as discussed above, then the audio compression system has a fixed end-to-end level that is never exceeded. However, in some applications, it is desirable to always drive the loudspeaker at its maximum output level (at the level leading to just acceptable distortion), in which case $G_C$ is calculated simply as $G_C(n)=E_{XMAX}/E_{FILT}(n)$. In either case, it is important to ensure that the converter 202 and amplifier 201 do not produce additional distortive effects.

According to FIG. 1, the compressor gain $G_C(n)$ is provided directly to the variable gain device 112 by the signal magnitude detector 111. In an alternate embodiment of the present invention, the signal magnitude detector 111 may instead feed the measured value of $E_{FILT}(n)$ to the variable gain device 112, in which case the variable gain device 112 would perform the comparison and determine the compressor gain $G_C(n)$ from either of the above equations. Optionally, the functionality of the filter 110, signal magnitude detector 111 and variable gain device 112 may be combined onto a single digital signal processor, eliminating the physical control path and obviating the need to exchange control signals between components.

Figure 5:
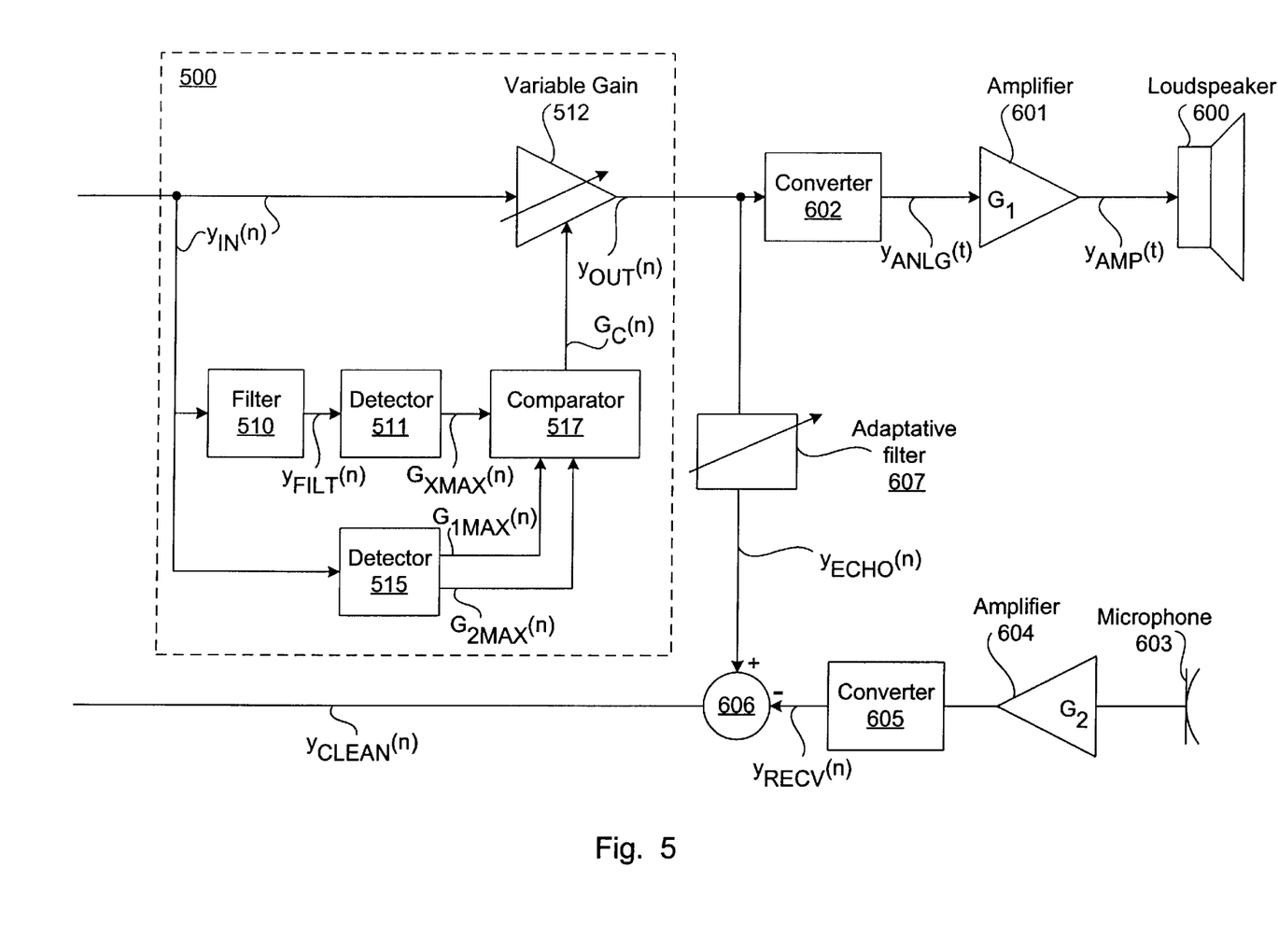
FIG. 5 is a block diagram of an audio compression system in accordance with an alternate embodiment of the present invention.

The above discussion has revolved around loudspeaker-induced distortion due primarily to excessive excursion. This can be compounded by non-linear behaviour of the loudspeaker amplifier 201 and by nonlinearities in an amplifier which may be placed in the tail path of an echo canceller used with the the system in FIG. 1. FIG. 5 shows an audio compression system 500 in accordance with an alternate embodiment of the present invention, which can be used to prevent distortion occurring due to any of these three potential sources.

With reference to FIG. 5, an input audio signal $y_{IN}(n)$ is fed to both a variable gain device 512 and a filter 510. The filter 510 produces a filtered audio signal $y_{FILT}(n)$ that is fed to a first signal magnitude detector 511, which then provides a time-varying gain limit $G_{XMAX}(n)$ to a comparator 517. The input audio signal $y_{IN}(n)$ is also fed to a second signal magnitude detector 515 that produces two time-varying gain limits $G_{1MAX}(n)$ and $G_{2MAX}(n)$ which also are fed to the comparator 517. The comparator then chooses the lowest of these gain limits and provides a compressor gain $G_C(n)$ to the variable gain device 512.

As usual, the variable gain device 512 applies the gain $G_C(n)$ to $y_{IN}(n)$ in order to produce $y_{OUT}(n)$, which exits the audio compressor 500 and is fed to a digital-to-analog converter 602. The converter 602 then feeds an analog output signal $y_{ANLG}(t)$ to an amplifier 601, which applies a constant gain $G_1$ and provides an amplified audio signal $y_{AMP}(t)$ to a loudspeaker 600.

Also shown in FIG. 5 is a microphone 603 for picking up sound waves usually emitted by someone talking in the room or car in which the loudspeaker and microphone are installed. The microphone 603 converts the received sound waves into an electrical signal, which is fed to an amplifier 604 and subsequently converted by an analog-to-digital converter 605, thereby to produce a digital signal $y_{RECV}(n)$.

It is not uncommon for sound emitted by the loudspeaker 600 to be reflected off of walls or similar structures, thereby entering the microphone 603 as echoes which interfere with the talker's voice. An adaptive filter 607 receives the outgoing digital signal $y_{OUT}(n)$ and attempts to model the impulse response of the room or car that is undergone by the loudspeaker output, thereby producing a filtered digital signal $y_{ECHO}(n)$ A summer 606 then subtracts $y_{ECHO}(n)$ from $y_{RECV}(n)$ in order to produce what is hopefully an echo-free talker's signal $y_{CLEAN}(n)$.

In operation, the filter 510 and first signal magnitude detector 511 are calibrated and also function as was described with reference to FIG. 1. Based on the measured signal magnitude $E_{FILT}(n)$ of the filtered audio signal $y_{FILT}(n)$, the first signal magnitude detector 511 produces a gain limit $G_{XMAX}(n)$ which, if applied by the variable gain device 512, would ensure that the loudspeaker does not produce excessive distortion. The gain limit $G_{XMAX}(n)$ could be calculated as $G_C(n)=\min[1,E_{XMAX}/E_{FILT}(n)]$. However, instead of the gain limit $G_{XMAX}(n)$ being provided directly to the variable gain device 512, it is first fed to the comparator 517.

Meanwhile, the signal magnitude $E_{IN}(n)$ of the (unfiltered) input audio signal $y_{IN}(n)$ is measured by the second signal magnitude detector 515. This signal magnitude detector compares the measured signal magnitude $E_{IN}(n)$ to $E_{1MAX}$ and to $E_{2MAX}$, respectively producing gain limits $G_{1MAX}(n)$ and $G_{2MAX}(n)$ according to the following formulae:

$$G_{1MAX}(n)=D_1\min[1,E_{1MAX}/E_{IN}(n)]$$

and $$G_{2MAX}(n)=D_2\min[1,E_{2MAX}/E_{IN}(n)].$$

$D_1$ and $D_2$ are the respective maximum allowable gains which lead to just acceptable distortion at the output of the amplifier 601 and converter 605 for the maximum expected input level. $E_{1MAX}$ is calibrated to ensure that variable gain device 512, converter 602 and amplifier 601 are not fed input levels which result in unacceptable distortion at the output of amplifier 601. Similarly, $E_{2MAX}$ is calibrated to ensure that the entire echo canceller tail path (components 603, 604 and 605) is not delivered signals which have an input level resulting in unacceptable distortion in the tail path.

At the comparator 517, the three gain limits $G_{XMAX}(n)$, $G_{1MAX}(n)$ and $G_{2MAX}(n)$ are compared, and the minimum gain limit is selected as the compressor gain $G_C$. By selecting the lowest of all three gain limits, the inventive audio compression system guarantees that the converter 602, the amplifier 601, the loudspeaker 600, and the amplifier 604 and converter 605 in the echo canceller tail path do not induce non-linear behaviour, thereby allowing for a high-fidelity reproduction of the audio signal $y_{IN}(n)$ without echo accompanying the return signal.

While preferred and alternate embodiments of the resent invention have been described and illustrated, it will be apparent to one skilled in the art that numerous modifications and variations are possible. For example, the entire audio compression system may operate in the analog domain. That is to say, $y_{IN}(n)$ may actually be $y_{IN}(t)$, a time-varying analog voltage level. The filter 110 could then be chosen as an arrangement of passive or active components in order to implement the desired frequency response.

The signal magnitude detector 111 would then act on a filtered analog waveform, comparing the detected signal magnitude to the maximum value using an analog comparator and subsequently determining the compressor gain $G_C(n)$ (or $G_C(t)$ in the analog domain) using the same equation as in the digital case. The analog signal magnitude detector may function by squaring the filtered audio signal $y_{FILT}(n)$ (or $y_{FILT}(t)$ in the analog domain) and integrating the result over a time interval determined by a circuit time constant. The variable gain device 112 may be an analog multiplier circuit, which simply multiplies the voltage level Of $y_{IN}(t)$ by that of $G_C(t)$ to produce $y_{OUT}(t)$. The resultant analog signal would then be delivered directly to the loudspeaker 200 with no need for a digital-to-analog converter.

Therefore, in view of the above description and the many further possible modifications that retain the spirit of the present invention, the scope of the invention is only to be limited by the claims appended hereto.

I claim:

1. An audio compression system for connection to a loudspeaker exhibiting a frequency-dependent excursion response for signals having a constant amplitude, the system comprising:
    a variable gain device for controllably varying an input audio signal in accordance with a control signal, thereby to produce an output audio signal for driving the loudspeaker;
    an electronic filter for filtering the input audio signal and producing a filtered audio signal therefrom, the filter having a magnitude response resembling the excursion response of the loudspeaker over a frequency range;
    a first detector for measuring the level of a characteristic present in the filtered audio signal, comparing the measured level to a first threshold level and determining a first gain limit related to the difference between the measured and first threshold levels;
    a second detector for measuring the level of said characteristic present in the input audio signal, comparing the measured level to a plurality of second threshold levels and determining a respective plurality of second gain limit signals each related to the difference between the measured level and a respective one of the plurality of second threshold levels; and
    a comparator connected to the second detector and also between the first detector and the variable gain device, for accepting the first gain limit from the first detector and the plurality of second gain limits from the second detector; determining the lowest gain limit; and setting the control signal to the lowest gain limit.

2. An audio compression system for connection to a loudspeaker exhibiting a pre-determined amount of distortion when the level of a signal input to the loudspeaker at each of a plurality of frequencies reaches a maximum signal level associated with that frequency, wherein the plot of maximum signal level versus frequency describes a "maximum voltage response" curve, the system comprising:
    a variable gain device for controllably varying an input audio signal in accordance with a control signal, thereby to produce an output audio signal for driving the loudspeaker;
    an electronic filter for filtering the input audio signal and producing a filtered audio signal therefrom; and
    a first detector for measuring the level of a characteristic present in the filtered audio signal, comparing the measured level to a threshold level, determining a first gain limit related to the difference between the measured and first threshold levels and setting the control signal to the first gain limit thus determined;
    wherein the filter has a magnitude frequency response curve resembling the maximum voltage response curve of the loudspeaker over a frequency range, reflected about its frequency axis.

3. A system according to claim 2, wherein the signals are digital signals and wherein the variable gain device, the electronic filter and the first detector are digital components.

4. A system according to claim 2, wherein the variable gain device, the electronic filter and the first detector are collocated in a digital signal processor.

5. A system according to claim 2, wherein the filtered audio signal has a magnitude, envelope, energy or power and wherein said characteristic is the magnitude, envelope, energy or power.

6. A system according to claim 2, wherein the filter has a magnitude frequency response curve substantially identical to the maximum voltage response curve reflected about its frequency axis.

7. A system according to claim 2, wherein the frequency range is approximately between 20 cycles per second and 20,000 cycles per second.

8. A system according to claim 2, wherein the filter has a second-order low-pass frequency response.

9. A system according to claim 2, wherein the filter has a magnitude frequency response that is substantially flat for frequencies below a resonant frequency and decreases at approximately twelve decibels per octave for frequencies above the resonant frequency.

10. A system according to claim 9, wherein the resonant frequency is between 180 and 400 cycles per second.

11. A system according to claim 2, wherein the filter has a second-order low-pass frequency response.

12. A system according to claim 2, wherein the first detector outputs the first gain limit instead of the control signal, the system further comprising:

a second detector for measuring the level of said characteristic present in the input audio signal, comparing the measured level to a plurality of second threshold levels and determining a respective plurality of second gain limit signals each related to the difference between the measured level and a respective one of the plurality of second threshold levels; and a comparator connected to the second detector and also between the first detector and the variable gain device, for accepting the first gain limit from the first detector and the plurality of second gain limits from the second detector; determining the lowest gain limit; and setting the control signal to the lowest gain limit.

13. A method of controllably modifying an input audio signal to produce an output audio signal for processing by a loudspeaker exhibiting a pre-determined amount of distortion when the level of a signal input to the loudspeaker at each of a plurality of frequencies reaches a maximum signal level associated with that frequency, wherein the plot of maximum signal level versus frequency describes a "maximum voltage response" curve, the method comprising the steps of:

electronically filtering the input audio signal to produce a filtered audio signal, wherein the input audio signal has frequency content over a frequency range, and wherein filtering is achieved by modifying the frequency content of the input audio signal in accordance with a shape resembling the maximum voltage response curve of the loudspeaker over a frequency range, reflected about its frequency axis;

measuring the level of a characteristic present in the filtered audio signal;

comparing the measured level to a threshold level; and controllably attenuating the input audio signal in accordance with the difference between the measured and threshold levels, thereby to produce the output audio signal.

14. A method according to claim 13, wherein the filtered audio signal has a magnitude, envelope, energy or power and wherein said characteristic is the magnitude, envelope, energy or power.

15. A method according to claim 13, wherein the frequency range is approximately between 20 cycles per second and 20,000 cycles per second.

* * * * *